United States Patent [19]
Oku

[11] Patent Number: 5,387,529
[45] Date of Patent: Feb. 7, 1995

[54] PRODUCTION METHOD OF A MESFET SEMICONDUCTOR DEVICE

[75] Inventor: Tomoki Oku, Itami, Japan

[73] Assignee: Mitsubishi Denki Kabushiki Kaisha, Tokyo, Japan

[21] Appl. No.: 152,963

[22] Filed: Nov. 16, 1993

Related U.S. Application Data

[62] Division of Ser. No. 950,762, Sep. 24, 1992, Pat. No. 5,300,445, which is a division of Ser. No. 687,294, Apr. 18, 1991, abandoned.

[30] Foreign Application Priority Data

Sep. 20, 1990 [JP] Japan .................................. 2-252709

[51] Int. Cl.$^6$ .......................................... H01L 21/338
[52] U.S. Cl. ........................................ 437/40; 437/41; 437/175; 437/231; 437/912
[58] Field of Search ...................... 437/39, 40, 20, 175, 437/912, 944, 229, 203, 41, 231

[56] References Cited

U.S. PATENT DOCUMENTS

| | | | |
|---|---|---|---|
| 4,564,583 | 1/1986 | Maeguchi | 430/312 |
| 4,731,339 | 3/1988 | Ryan et al. | 437/29 |
| 4,839,310 | 6/1989 | Hollis et al. | 437/41 |
| 4,929,567 | 5/1990 | Park et al. | 437/41 |
| 4,992,387 | 2/1991 | Tamura | 437/41 |
| 5,006,478 | 4/1991 | Kobayashi et al. | 437/41 |
| 5,037,767 | 8/1991 | Daniel | 437/28 |
| 5,053,348 | 10/1991 | Mishra et al. | 437/41 |
| 5,105,242 | 4/1992 | Fujihira et al. | 357/22 |
| 5,204,278 | 4/1993 | Imamura et al. | 437/40 |

FOREIGN PATENT DOCUMENTS

| | | |
|---|---|---|
| 64370 | 11/1982 | European Pat. Off. . |
| 74845 | 3/1983 | European Pat. Off. . |
| 201111 | 11/1986 | European Pat. Off. . |
| 57-62543 | 4/1982 | Japan . |
| 59-119728 | 7/1984 | Japan . |
| WO80/02752 | 12/1980 | WIPO . |

OTHER PUBLICATIONS

Wolf et al, "Silicon Processing For The VLSI ERA", Lattice Press, 1989, pp. 308–327.
Hanyu et al, "Super Low–Noise HEMTs With A T–Shaped WSi$_x$ Gate" Electronics Letters, vol. 24, No. 21, 1988, pp. 1327–1328.
Nikkei Microdevices, 1989, pp. 91–95.
Yamasaki et al, "GaAs LSI–Directed MESFET's With Self-Aligned Implantation For n+–Layer Technology (SAINT)", IEEE Transactions on Electron Devices, vol. ED-29, No. 11, 1982, pp. 1772–1777.
Imai et al, "Novel Process For Direct Delineation of Spin On Glass (SOG)", Japanese Journal Of Applied Physics, vol. 29, No. 11, 1990, pp. 2653–2656.

(List continued on next page.)

Primary Examiner—T. N. Quach
Attorney, Agent, or Firm—Leydig, Voit & Mayer

[57] ABSTRACT

A particle beam irradiates a thermohardening resin and selectively hardens the thermohardening resin of the implanted region. The non-hardened resin not irradiated is removed with high selectivity and an inverted pattern of the hardened resin remains as a mask. Using the same photoresist mask employed in the irradiation for selective hardening, ion implantation through the hardened resin forms spaced apart implanted regions in the substrate. The removal of the photoresist and the non-hardened resin leaves an aperture for metal deposition to form Schottky barrier. Hardened resin from portions of spaced apart implanted regions is removed, followed by metal deposition forming source and drain electrodes to complete a MESFET. Spin-on-glass as the thermohardening resin is also disclosed.

7 Claims, 14 Drawing Sheets

OTHER PUBLICATIONS

Kubena et al, "Dot Lithography For Zero-Dimensional Quantum Wells Using Focused Ion Beams", Journal of Vacuum Science Technology, vol. B6, No. 1, 1988, pp. 353–356.

Briska et al, "Method Of Etching Fine Structures In Silicon", IBM Technical Disclosure Bulletin, vol. 22, No. 3, 1979.

Abdel-Motaleb et al, A Simple Self-Aligned GaAs MESFET Using Polyimide, Solid-State Electronics, vol. 30, No. 4, 1987, pp. 361–363.

Bartle et al, "Selective Area Ion Implantation For Gallium Arsenide Microwave Devices And Circuits", G. E. C. Journal of Research, vol. 1, No. 3, 1983, pp. 174–177.

Nagahama et al, "A High Electron Mobility Transistor With A Mushroom Gate Fabricated By Focused Ion Beam Lithography", IEEE MTT International Microwave Symposium Digest, 1988, pp. 251–253.

Komuro et al., "Ion Beam Exposure of Resist Materials", J. Electrochem. Soc., vol. 126, No. 3, Mar. 1979, pp. 483–490.

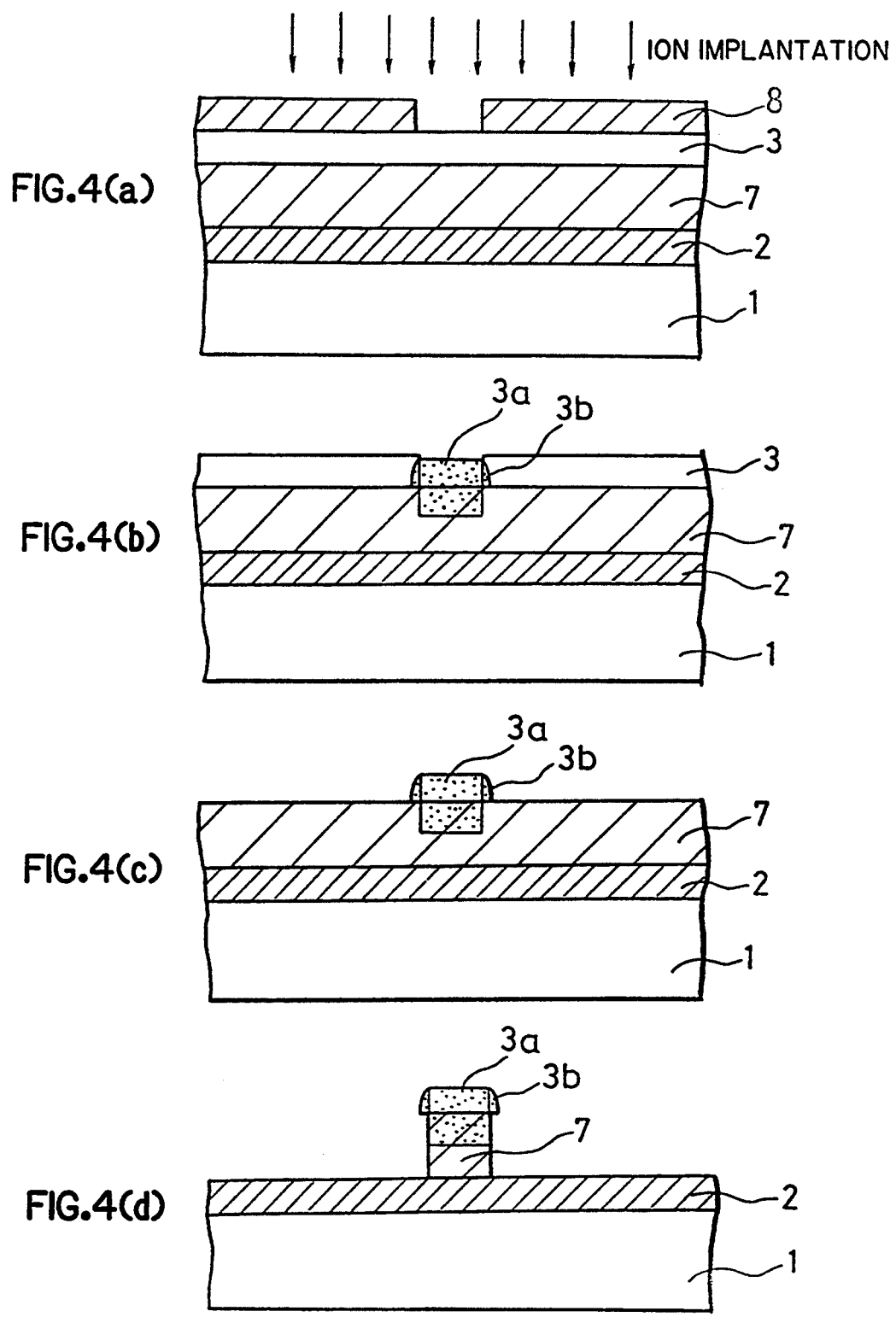

F I G. 7
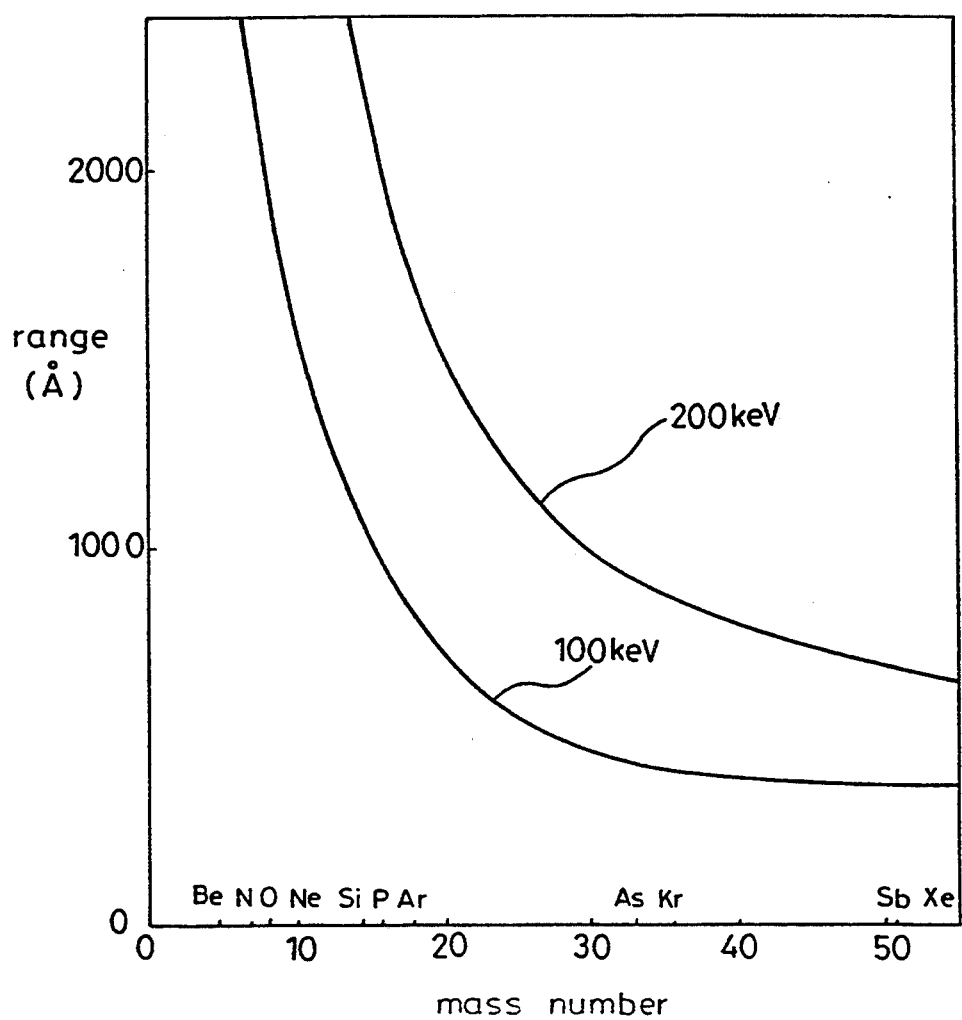

PRODUCTION METHOD OF A MESFET SEMICONDUCTOR DEVICE

This disclosure is a division of U.S. patent application Ser. No. 07/950,762, filed Sep. 24, 1992, now U.S. Pat. No. 5,300,445, which is, itself, a division of U.S. patent application Ser. No. 07/687,294, filed Apr. 18, 1991, now abandoned.

FIELD OF THE INVENTION

The present invention relates to a method of producing a semiconductor device and, more particularly, to a method of producing a fine mask pattern in the production of a compound semiconductor device.

BACKGROUND OF THE INVENTION

FIGS. 8(a)–8(c) show a method of producing an aperture for a gate of an HEMT (High Electron Mobility Transistor) described in *Electronics Letters*, volume 24, 1988, page 1327, by Hanyu et al.

As shown in FIG. 8(a), an $SiO_2$ film 2a is deposited on a compound semiconductor substrate 1 by plasma CVD (Chemical Vapor Deposition) or sputtering. Next, a photoresist 4 is deposited and formed into a photoresist pattern. An optical exposure or an EB (electron beam) exposure is used for patterning of the photoresist 4 and an appropriate photoresist is used depending on the exposure method used. EB exposure is used by Hanyu. Thereafter, as shown in FIG. 8(b), the $SiO_2$ film 2a is etched by RIE (Reactive Ion Etching) using the photoresist pattern as a mask. Afterwards, as shown in FIG. 8(c), the photoresist 4 is removed so that the $SiO_2$ film 2a has an aperture. In Hanyu, metal is deposited on the entire surface of the substrate by sputtering. Thus, a gate having a Schottky barrier comprising the metal and the semiconductor is produced at the aperture for the HEMT.

FIGS. 9(a)–9(c) show a triple-layer photoresist production method used for producing a dummy pattern for a gate in a SAINT (Self-Aligned Implantation for N+-layer Technology) MESFET (Metal Semiconductor Field Effect Transistor) described in *IEEE Transactions*, volume ED-29, 1982, page 1772, by Yamasaki et al.

As shown in FIG. 9(a), a lower layer photoresist 7 is deposited on a compound semiconductor substrate 1 and an $SiO_2$ film 9 is deposited thereon by sputtering. An upper layer photoresist 8 having a higher resolution than that of the lower layer photoresist 7 is then deposited. Next, as shown in FIG. 9(b), the sputtered $SiO_2$ film 9 is etched by RIE using, for example, a mixture of $CF_4$ and $O_2$, using the upper layer photoresist 8 as a mask. Finally, as shown in FIG. 9(c), RIE using, for example, $O_2$ and the sputtered $SiO_2$ film 9 as a mask, removes the lower layer photoresist 8.

In this technique, the pattern of the upper layer photoresist 8, which has a low anti-RIE property but high resolution, is transferred to the lower layer photoresist 7 which has high thermal stability, a strong anti-RIE property, and a large thickness. The thermal stability and anti-RIE property of the lower layer photoresist 7 are utilized in a later process step. Furthermore, processing requiring a large film thickness and high resolution can be carried out.

The prior art production methods described above have the following problems.

In the method of producing an aperture shown in FIG. 8(c), when the $SiO_2$ film 2a is etched by RIE, the photoresist 4 is also etched, thereby increasing the size of the aperture. When the aperture is used to form the gate of an FET, the gate length is increased by etching of the photoresist 4. Even when the photoresist 4 has an aperture size of 0.2 micron produced by EB exposure, the aperture size of the $SiO_2$ film 2a after RIE increases to about 0.3 micron. This reduces the transconductance, gm, of the transistor.

In the method shown in FIGS. 8(a)–8(c), the exposed part of the surface of the semiconductor substrate 1 is damaged when the $SiO_2$ film 2 is etched by RIE. The damage below the gate of the transistor reduces the controllability of transconductance and the threshold voltage, $V_T$.

In the triple-layer photoresist production method shown in FIGS. 9(a)–9(c), when the sputtered $SiO_2$ film 9 is etched by RIE using the upper layer photoresist 8 as a mask, the photoresist 8 is also etched and the pattern of the sputtered $SiO_2$ film 9 becomes smaller than that of the upper layer photoresist 8. When the lower layer photoresist 7 is etched by RIE with $O_2$ gas and using the sputtered $SiO_2$ film 9 as a mask, the pattern of the photoresist 7 becomes still smaller than that of the sputtered $SiO_2$ film 9. Therefore, this method for producing a narrow gate requires RIE conditions having quite high selectivity, resulting in processing difficulties. The gate length of a SAINT MESFET is typically about 0.3 micron and it is difficult to further reduce the size at the present time.

SUMMARY OF THE INVENTION

The present invention is directed to solving the above problems and has for its object providing a method for producing a semiconductor device that can transfer a pattern obtained by optical exposure or electron beam exposure onto a metal, insulating film, or photoresist on a substrate in a fine pattern and with high controllability.

It is another object of the present invention to provide a production method for a semiconductor device that can produce an ion implantation region self-aligned with the pattern during the production of such a pattern.

It is still another object of the present invention to provide a production method for a semiconductor device that can use any kind of dopant ions and any quantity of ion implantation of the self-alignedly produced ion implantation region.

It is still another object of the present invention to provide a method of producing a MESFET, a MESFET having a low resistance gate electrode, or a HEMT using the above-described production method.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

In accordance with a first aspect of the present invention, a thermohardening resin disposed on a substrate is selectively irradiated and hardened by a particle beam, an inverted pattern is produced by removing the non-hardened part of the resin, and the pattern is utilized as a mask for later processing.

In accordance with a second aspect of the present invention, a particle beam implantation process includes implanting dopant ions that are to be donors, acceptors, or deep levels in a semiconductor substrate including a semiconductor layer with an implantation energy large enough so that the ions reach the semiconductor layer.

In accordance with a third aspect of the present invention, a thermohardening resin is deposited on a semiconductor substrate or on a substrate on which an insulating film is deposited, a photoresist pattern is formed on the thermohardening resin, ions that are to be donors, acceptors, or deep levels in the semiconductor are implanted at an energy at which ions reach the semiconductor substrate, the thermohardening resin is sufficiently hardened to produce an ion implantation region in the semiconductor substrate, the photoresist pattern and the non-hardened thermohardening resin are removed, a pattern is transferred to the semiconductor substrate using the remaining thermohardening resin as a mask, and an aperture is produced that is self-aligned with the ion implantation region.

In accordance with a fourth aspect of the present invention, a thermohardening resin is deposited on a semiconductor substrate or on a semiconductor substrate on which an insulating film is disposed, a photoresist pattern is formed on the thermohardening resin, particle beam implantation is carried out using the photoresist pattern as a mask, the thermohardening resin in the particle beam implantation region is hardened, and ions that are to be donors, acceptors, or deep levels in the semiconductor are implanted at an energy at which the ions reach the semiconductor substrate, thereby producing an ion implantation region in the semiconductor substrate. The photoresist pattern and the non-hardened thermohardening resin are removed, a pattern is transferred onto the semiconductor substrate and the insulating film on the semiconductor substrate using the remaining thermohardening resin as a mask, and an aperture is produced that is self-aligned with the ion implantation region.

In accordance with a fifth aspect of the present invention, in the above-described production method, an active region is produced in a semiconductor substrate, ion implantation regions in which ions that are to be donors or acceptors in the semiconductor are implanted to form source and drain regions in the substrate, a Schottky metal is deposited in an aperture that is self-aligned with the ion implantation region by the pattern transfer, the thermohardening resin on the source and drain regions is removed, and ohmic electrodes are produced where the thermohardening resin is removed, thereby producing a MESFET.

In accordance with a sixth aspect of the present invention, in a production method for a semiconductor device, a thermohardening resin is deposited directly on or with an intervening insulating film on a compound semiconductor substrate including an active region, gate electrode, and drain electrode, and source electrode production regions opposite the thermohardening resin are covered with photoresist, the thermohardening resin is irradiated and hardened by a particle beam using the photoresist pattern as a mask, the non-hardened thermohardening resin on a photoresist pattern and at gate electrode production region is removed, the compound semiconductor substrate or the insulating film on the substrate exposed thereby is etched to produce a recess groove reaching the active layer, a Schottky metal is deposited in the groove, non-hardened thermohardening resin at the source and drain electrode production regions is removed, thereby exposing the compound semiconductor substrate, and ohmic electrodes are formed on the exposed part, thereby producing an HEMT.

In accordance with the first aspect of the present invention, particle beam irradiation of the thermohardening resin hardens the irradiated part of the thermohardening resin but the non-irradiated part is not hardened. Therefore, non-hardened resin of the non-implanted part can be removed with high selectivity relative to the hardened resin and an inverted pattern comprising hardened resin is produced.

When ions which are to be donors, acceptors, or deep levels in the semiconductor are used for the particle beam and they are implanted at an implantation energy at which the ions can reach the semiconductor substrate, hardened resin as well as the ion implantation region in the substrate are produced self-aligned with an inverted pattern comprising hardened resin.

When this inverted pattern is transferred to the substrate, an aperture pattern self-aligned with the ion implantation region in the substrate is produced. The inverted pattern comprising hardened resin includes the particle beam implantation region and a region produced by thermal diffusion from the particle beam implantation region. Because of the diffusion, the aperture in a pattern becomes smaller than the aperture in the initial stage used for implanting a particle beam into the thermohardening resin, thereby preventing broadening during production of the aperture. By depositing a Schottky metal at this aperture and ohmic electrodes on the ion implantation region, a MESFET can be easily produced.

In a two-part particle beam implantation process in one of which ions cannot reach the semiconductor substrate and during the other of which ions that are to be donors, acceptors, or deep levels in the semiconductor reach the semiconductor substrate before removal of a photoresist, a self-aligned aperture pattern that does not broaden is produced within the implantation region. The particle beam implantation process for hardening the thermohardening resin and ion implantation for producing an ion implantation region can be carried out independently so that the kind of ions and the amount of the implantation in the active region can be arbitrarily selected.

If an aperture pattern is provided using an inverted pattern that is produced by selectively irradiating a thermohardening resin and a Schottky metal is deposited on the aperture pattern and an ohmic metal is deposited on another aperture pattern, a fine pattern gate that is self-aligned with the ohmic electrode is produced and the distance between the ohmic metal and the Schottky metal is determined by the initial stage photoresist pattern.

BRIEF DESCRIPTION OF THE DRAWINGS

FIGS. 4(a)-4(d) are cross-sectional side views showing a method of producing a semiconductor device in accordance with a fourth embodiment of the present invention;

FIG. 7 is a diagram showing the range as a function of energy of implanted ions in an $SiO_2$ film;

DETAILED DESCRIPTION OF THE PREFERRED EMBODIMENTS

Figure 1A:
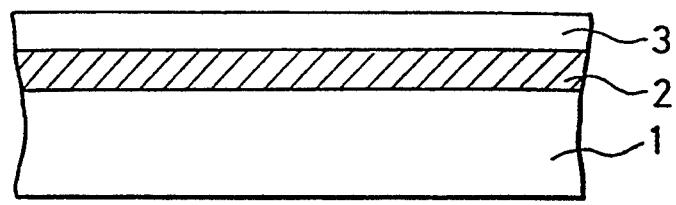
FIGS. 1(a)-1(e) are cross-sectional side views showing a method of producing a semiconductor device in accordance with a first embodiment of the present invention.

FIGS. 1(a)-1(e) are cross-sectional side views showing process steps in a method of producing a semiconductor device in accordance with a first embodiment of the present invention. In FIG. 1(a), an SiN film 2 is deposited on a compound semiconductor substrate 1 by plasma CVD and a thermohardening resin film 3 is deposited on the SiN film 2 and sintered at 100° C.

Spin on glass (SOG) is an example of the thermohardening resin 3, resin. SOG resin is obtained by dissolving Si—O—$CH_3$ in ethanol and, when it is deposited on a wafer, it becomes a thin film approximately 100 to 500 nanometers thick. When this film is heated, $CH_3$ and $H_2O$ are driven off and an $SiO_2$ film is left on the wafer. When it is heated to about 1,000° C., the $SiO_2$ film has approximately the same film quality as that of a thermal $SiO_2$ film and the etching rate in hydrofluoric acid is the same as that of a thermal $SiO_2$ film (an etching rate of 3 nanometers per minute in hydrofluoric acid diluted 1:200 times with water). Accordingly, when the film is heated only to 100° C., as in the above-described embodiment, the etching rate is quite large, 70 nanometers per minute in hydrofluoric acid diluted 1:200 times with water.

Figure 1B:
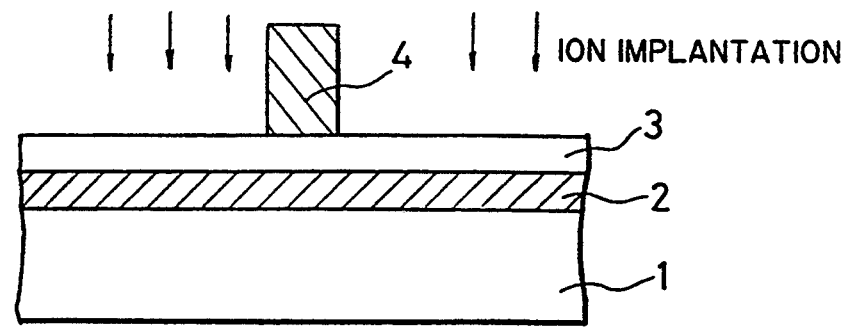

As shown in FIG. 1(b), a photoresist pattern 4 is produced on the hardened thermohardening resin 3. The photoresist 4 may be an electron beam photoresist. However, here, an optical photoresist with a 0.4 micron pattern is used. Then, a particle beam irradiates the film 3 using the photoresist pattern 4 as a mask. For the particle beam, an electron beam, an ion beam, or a neutral particle beam can be used. Here, ion implantation is adopted because ion implantation is easily obstructed, an advantage in hardening resin. Here, the ions that stop in the SiN film 2 preferably do not become dopant impurities in the film, so that silicon or nitrogen ions, are desirably used. When ions that could become dopant impurities are selected, the film containing them should be removed after metal is deposited on the aperture.

The implantation energy of the ions is selected such that the penetration range thereof is larger than the thickness of the thermohardening resin and is smaller than the thickness of the semiconductor substrate. The penetration ranges of ions in an $SiO_2$ film are shown in FIG. 7. This graph shows that silicon ions or argon ions can be injected at 100 KeV and krypton ions can be injected at 200 KeV when the thickness of the 2 thermohardening resin is 70 nanometers and that of the SiN film is 100 nanometers. The implantation is sufficient at $1 \times 10^{15} cm^{-2}$ when silicon ions are used as found from measurements after sintering. With argon ions or krypton ions, the range is short and, therefore, the resin is hardened with a smaller quantity of implanted ions. The thickness of the thermohardening resin hardened by ion implantation is thinner than before being hardened.

Figure 1C:
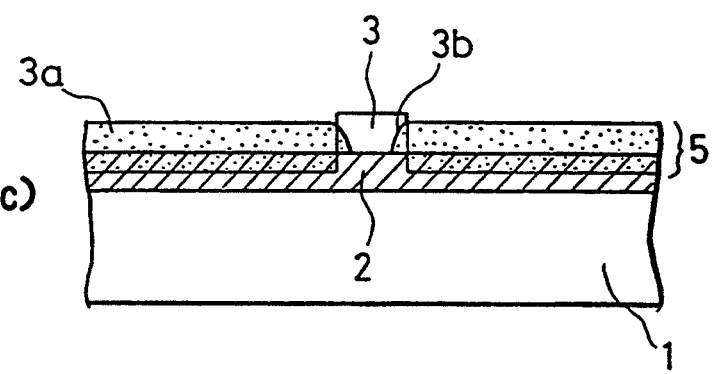

As shown in FIG. 1(c), reference numeral 5 designates a first ion implantation region. The first ion implantation region 5 is a region where ions that are not donors, acceptors, or deep levels in the compound semiconductor are implanted. In FIG. 1(c), the photoresist 4 is removed. In region 3b ions are not implanted, but the resin hardened by thermal diffusion from the implantation region 3a. Therefore, the size of the region 3b can be controlled by implantation conditions, such as ion energy, the kind of ions, and implantation rate.

Figure 1D:
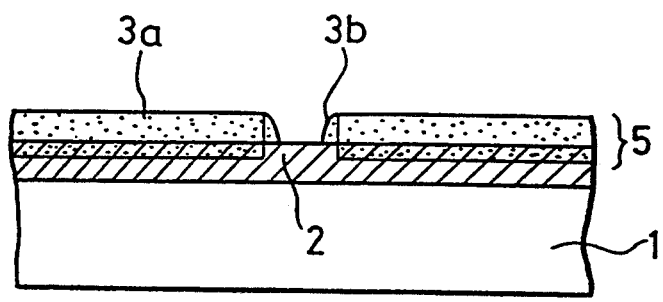

FIG. 1(d) shows the structure after one minute and thirty seconds in hydrofluoric acid diluted 1:200 with water. The portion of the film where the resin is hardened is only removed to the extent of 50 nanometers or less (etching rate: 3 nanometers per minute). Therefore, even if some of the resin is removed by hydrofluoric acid, the hardened portion of the resin is hardly etched.

Figure 1E:
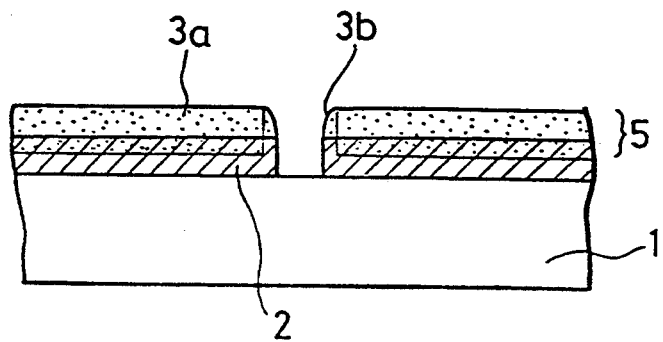

As shown in FIG. 1(e), the SiN film 2 is plasma etched using the hardened resin as a mask. The relative etching rates of SiN to $SiO_2$ is about 15 to 1 when $SF_6$ is used as an etching gas.

In the above-described processes, all the etching processes have a selectivity of 10 or more and a method of hardening a resin, such as ion implantation, having high controllability is used. Therefore, there are no unstable factors in this production method. Furthermore, the fact that the thermohardening resin is hardened by thermal diffusion of ions from the implantation region means that the pattern which is finally produced is smaller than the initial pattern. This means that the problem of pattern broadening at the time of producing an aperture pattern in the prior art method is solved.

Figure 2A:
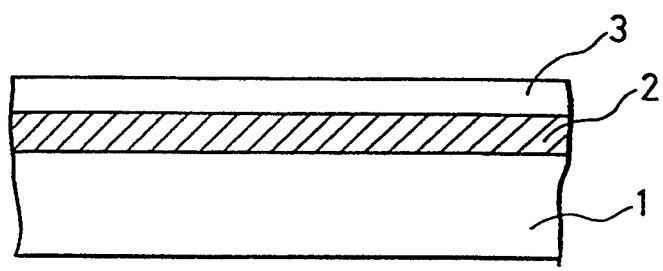
FIGS. 2(a)-2(e) are cross-sectional side views showing a method of producing a semiconductor device in accordance with a second embodiment of the present invention.
Figure 2B:
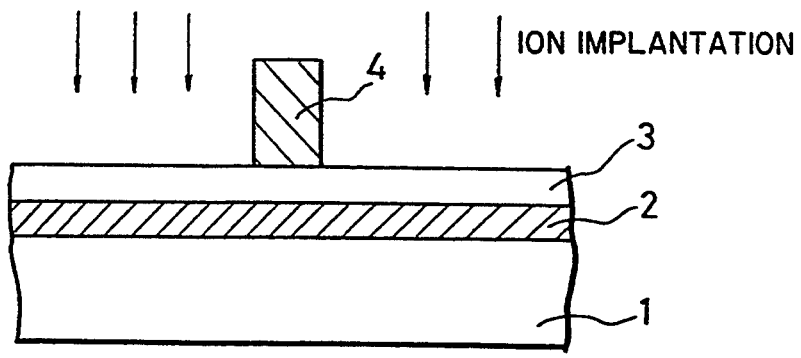

A second embodiment of the present invention utilizes the above-described first embodiment. FIG. 2(a) is the same as FIG. 1(a). In FIG. 2(b), the photoresist 4 is produced and the ion implantation is carried out. Ions which are to be donors, acceptors, or deep levels in the compound semiconductor are implanted into the compound semiconductor and simultaneously harden the thermohardening resin. Generally, silicon ions are implanted in as donors, beryllium or magnesium ions are implanted as acceptors, and boron or hydrogen ions are implanted in order to produce deep levels. The energy of the respective ions can be selected from FIG. 7; for example, silicon may be implanted at an energy of 200 KeV and a dosage amount of $1 \times 10^{15} cm^{-2}$. Here, the thickness of the thermohardening resin is 70 nanometers and the thickness of the SiN film is 100 nanometers.

Figure 2C:
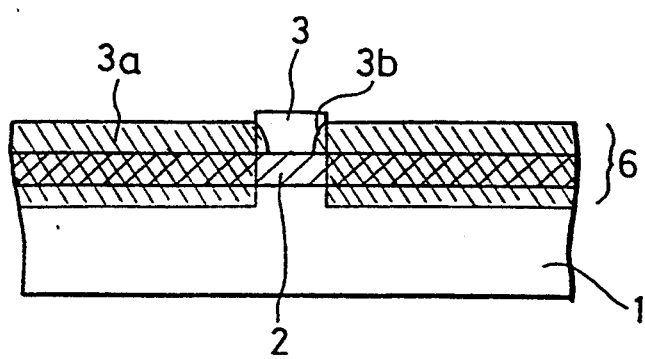
Figure 2D:
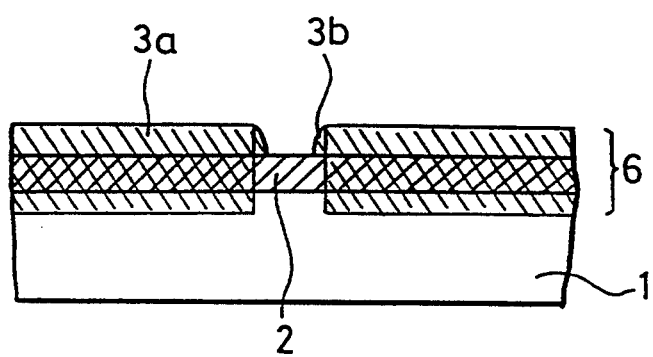
Figure 2E:
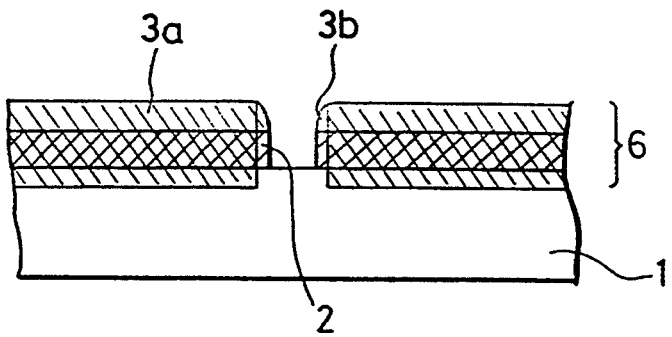

FIGS. 2(c)-2(e) show the same production steps as those of FIGS. 1(c)-1(e). Ions which are to be donors, acceptors, or deep levels in the compound semiconductor are implanted in a second ion implantation region 6. Thereafter, by annealing, a region of the compound semiconductor where ions are implanted become n-type, p-type, or insulating in accordance with the kind of implanted ions. The aperture pattern is self-aligned at a position spaced from the active region or the insulating region by the thermal diffusion distance 3b. In this case, the SiN film 2 is not necessarily required.

Figure 3A:
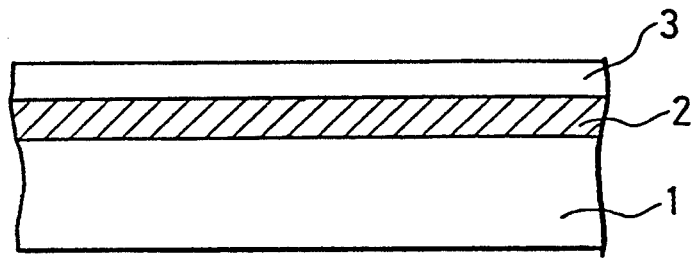
FIGS. 3(a)-3(f) are cross-sectional side views showing a method of producing a semiconductor device in accordance with a third embodiment of the present invention.
Figure 3B:
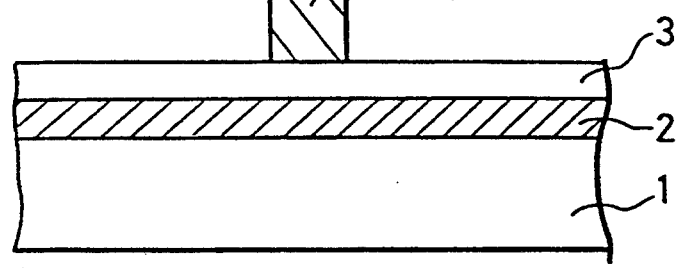
Figure 3C:
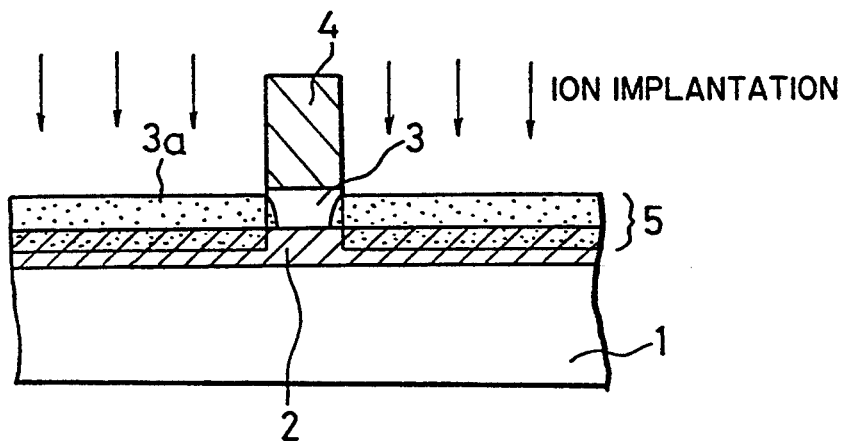

Finally, a third embodiment of the present invention is illustrated in FIGS. 3(a)-3(f). FIG. 3(a) is the same as FIG. 1(a). In FIG. 3(b), photoresist 4 is produced and ions are implanted at an energy at which the ions do not reach the compound semiconductor but do harden the thermohardening resin 3, thereby producing a first ion implantation region 5, as shown in FIG. 3(c).

Figure 3D:
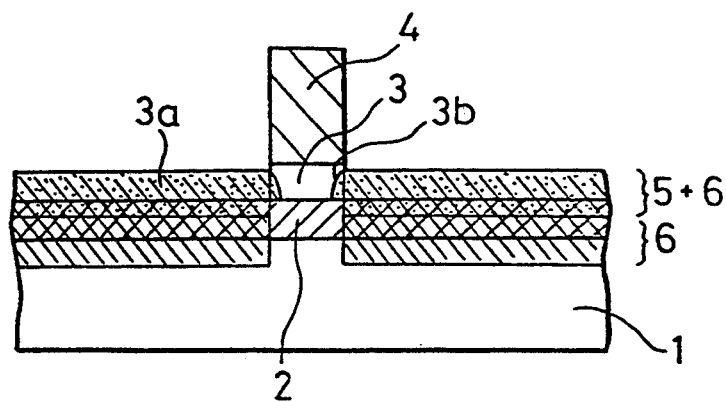

Thereafter, ions which are to be donors, acceptors, or deep levels are implanted at an energy at which the ions reach the compound semiconductor substrate, thereby producing a second ion implantation region 6 shown in FIG. 3(d). In this way, hardening of the thermohardening resin 3 and ion implantation into the compound semiconductor 1 can be carried out independently and relaxing process condition constraints. As an example, the hardening of the resin is carried out by implanting silicon ions or argon ions at 100 KeV and about $1 \times 10^{15} \text{cm}^{-2}$ or krypton ions at 200 KeV and about $1 \times 10^{15} \text{cm}^{-2}$, thereby hardening the thermohardening resin 3, and thereafter beryllium ions are implanted at 100 KeV or less and about $1 \times 10^{15} \text{cm}^{-2}$ to produce a p-type active layer of required concentration. Silicon ions are implanted at 100 KeV or less at about $1 \times 10^{13} \text{cm}^{-2}$ to produce a required concentration n-type active layer. These implantation energies are selected from FIG. 7.

Figure 3E:
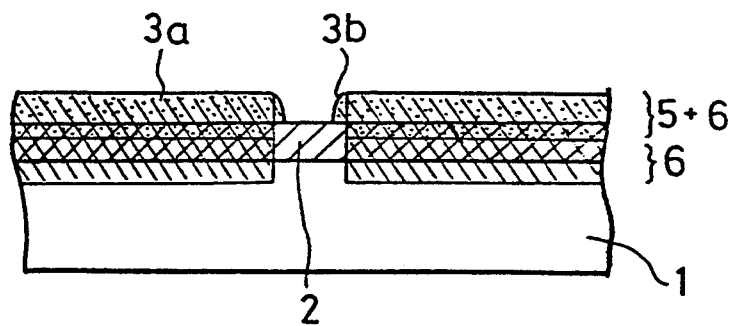
Figure 3F:
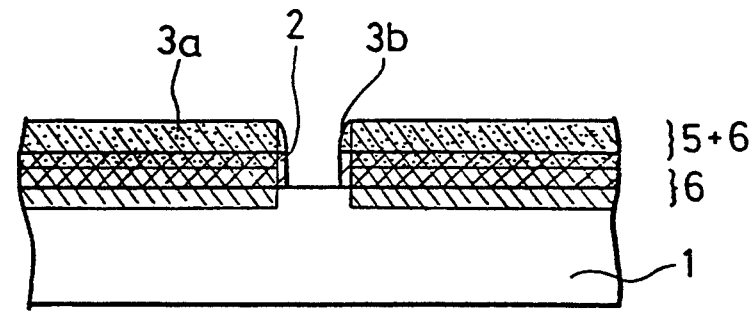

The processes that are to be carried out thereafter, that is, the processes of FIG. 3(e) and 3(f), are the same as those of FIGS. 1(e) and 1(f) and FIGS. 2(d) and 2(e).

FIGS. 4(a)-4(d) show a fourth embodiment of the present invention for producing a triple-layer photoresist which has a photoresist layer 8 as an upper layer and a photoresist 7 as a lower layer sandwiching the thermohardening resin 3.

As shown in FIG. 1(a), ions are implanted in the thermohardening resin 3 using the upper layer photoresist 8 as a mask and the thermohardening resin 3 is thereby hardened.

The upper layer photoresist 8 is removed as shown in FIG. 4(b). When the non-hardened part of the resin 3 layer is also removed with hydrofluoric acid, thermohardened resins 3a and 3b remain, as shown in FIG. 4(c).

Next, the lower layer photoresist 7 is etched by RIE using $O_2$ and the thermohardened resin parts 3a and 3b as a mask, as shown in FIG. 4(d), thereby completing the triple-layer photoresist.

In the prior art production method utilizing a triple-layer photoresist, there is a disadvantage in that a pattern is too small, as discussed above in the background of the invention section. However, in this fourth embodiment, RIE is carried out only once to produce a triple-layer photoresist. Therefore, there is less probability that the pattern will become smaller.

Therefore, a process utilizing the thermal stability and anti-RIE property of the lower layer photoresist 7 and a process utilizing the thickness and high resolution of the lower layer photoresist can be carried out with good control and a fine pattern gate and wiring pattern are precisely produced.

The above-illustrated embodiment can be applied to the production of the following compound semiconductor devices:

(1) a MESFET,
(2) a self-aligned refractory gate MESFET having a low resistance metal on a gate, and
(3) a compound semiconductor HEMT.

First of all, an embodiment of a method for producing of a self-aligned refractory gate MESFET having a low resistance metal will be described. A MESFET can be produced by changing only a part of the process.

Figure 5A:
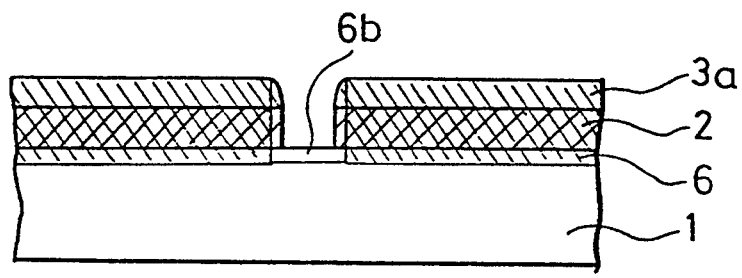
FIGS. 5(a)-5(e) are cross-sectional side views showing a method of producing a semiconductor device in accordance with fifth and sixth embodiments of the present invention.

FIG. 5(a) corresponds to FIG. 2(e) and FIG. 3(f). The n-type active layer region 6 is produced before the process of FIG. 2(a) and FIG. 3(a). When a refractory metal silicide or refractory metal 10, such as WSi, W, or Mo, is deposited by sputtering or evaporation, the structure shown in FIG. 5(b) results. Annealing activates the ion implantation region 6 to produce n+ active region 6a in the semiconductor substrate 1.

Figure 5B:
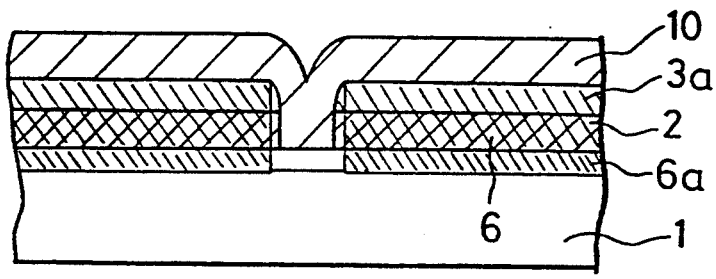
Figure 5C:
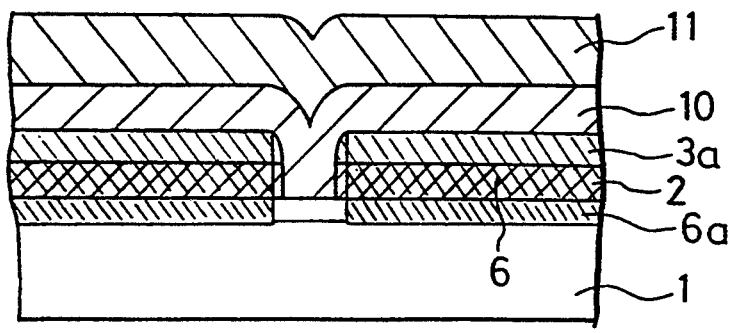
Figure 5D:
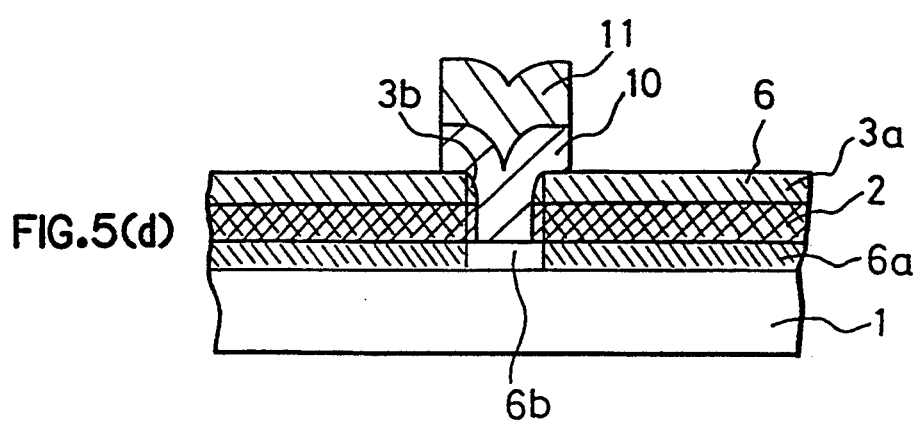

Next, a low resistance metal 11, such as Au, is deposited by sputtering or evaporation, thereby producing the structure of FIG. 5(c). Next, as shown in FIG. 5(d), a gate pattern of photoresist is produced on the low resistance metal 11 and the portions of low resistance metal 11 and refractory metal 10 that are not needed are removed by ion milling using the photoresist as a mask. Finally, the photoresist is removed, thereby producing a low resistance gate comprising the low resistance metal 11 and the refractory metal 10.

Figure 5E:
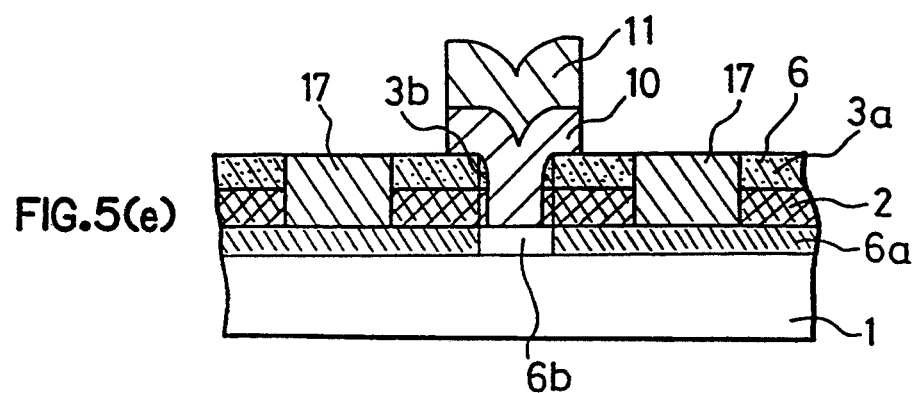

Thereafter, contact holes are opened in the thermohardening resin 3 and the SiN film 2 and an ohmic contact metal is deposited in the contact holes, thereby producing source and drain electrodes, as shown in FIG. 5(e). Alternatively, after the thermohardening resin 3 and SiN film 2 are removed, an ohmic contact metal is deposited, thereby producing source and drain electrodes.

When only a MESFET is produced, the gate is patterned from the structure of FIG. 5(b), unneeded parts of refractory metal 10 are removed by RIE, hardened thermohardening resins 3a and 3b and the SiN film 2 are removed, and annealing is carried out. In both cases, the SiN film 2 is not required if a process according to the second embodiment is used.

In a MESFET produced in this way, it is possible to produce a narrow gate comprising a refractory metal spaced from the thermohardening region by the thermal diffusion distance 3b, self-alignedly with good control and reproducibility.

Figure 6A:
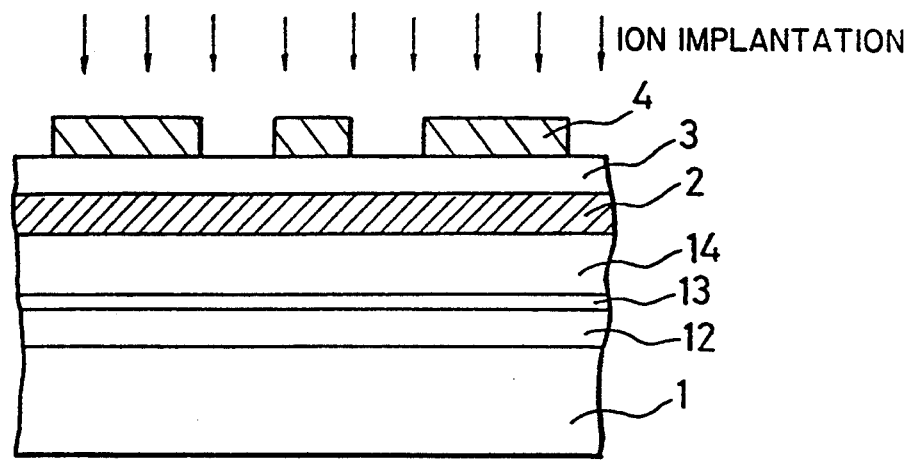
FIGS. 6(a)-6(j) are cross-sectional side views showing a method of producing a semiconductor device in accordance with a seventh embodiment of the present invention.
Figure 6B:
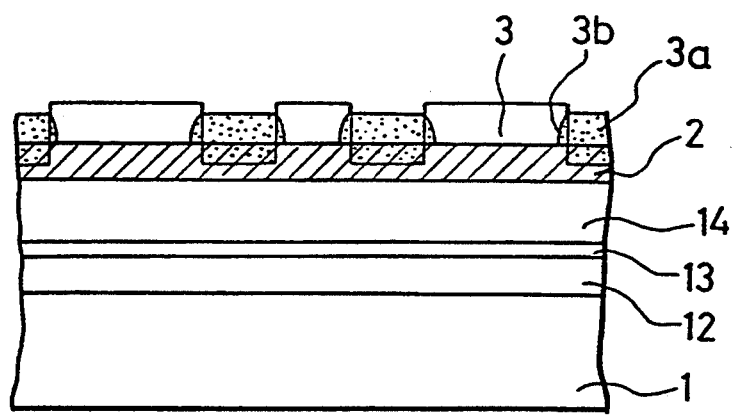

An embodiment of a method of producing an HEMT begins with the structure shown in FIG. 6(a). There, an SiN film 2 is disposed on an n+-GaAs layer 14, an AlGaAs layer, and a 13 i-GaAs layer 12 epitaxially grown on a compound semiconductor substrate 1. A thermohardening resin 3 is deposited thereon, a gate pattern and a source and drain pattern comprising photoresist 4 are produced thereon at the same time, and ions are implanted. In this method, the non-hardened thermohardening resin 3 remains on the gate, the source, and the drain. When the photoresist 4 is removed, the structure shown in FIG. 6(b) is obtained.

Figure 6C:
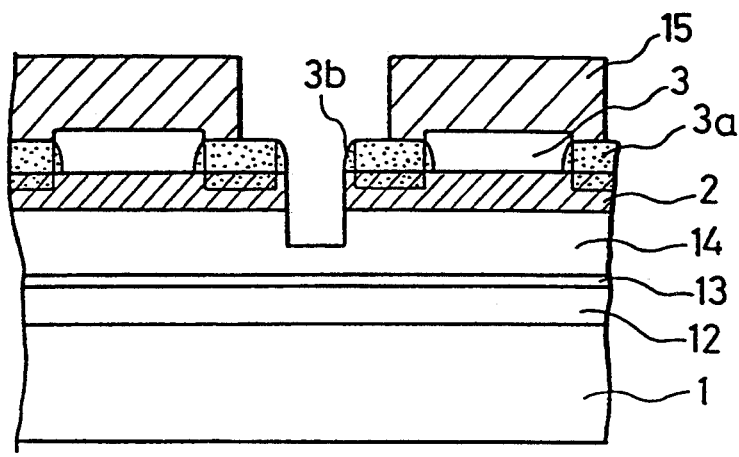

As shown in FIG. 6(c), patterning is carried out using photoresist 15. The thermohardening resin 3 at the gate part is removed with hydrofluoric acid and the SiN film 2 is removed by plasma etching. The n+-GaAs layer 14 is etched by dry or wet etching to produce a recess.

Figure 6D:
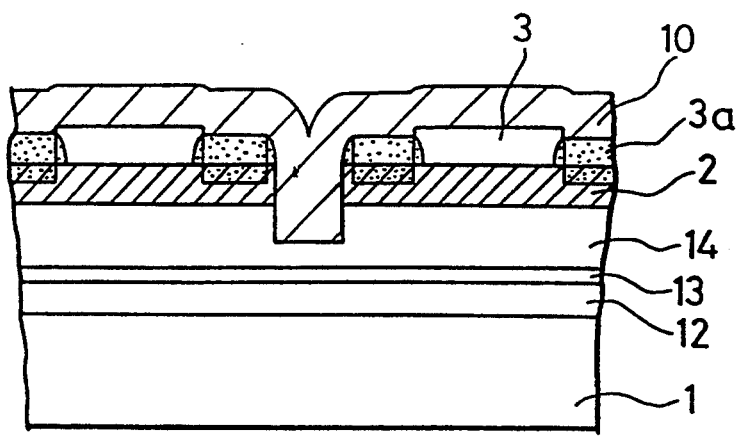
Figure 6E:
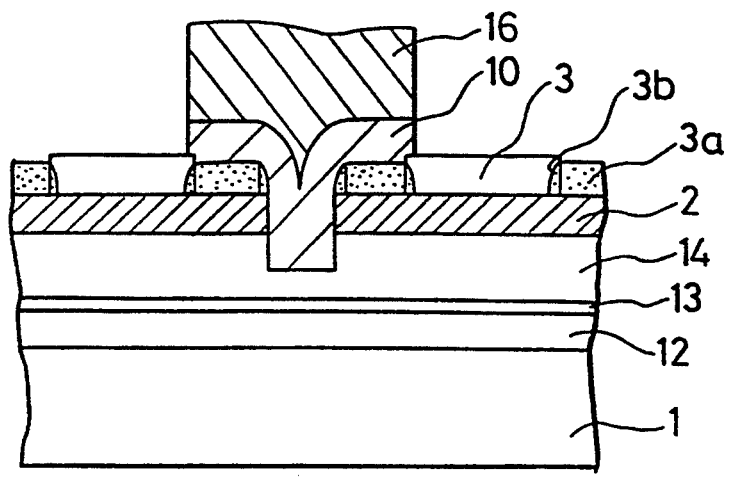
Figure 6F:
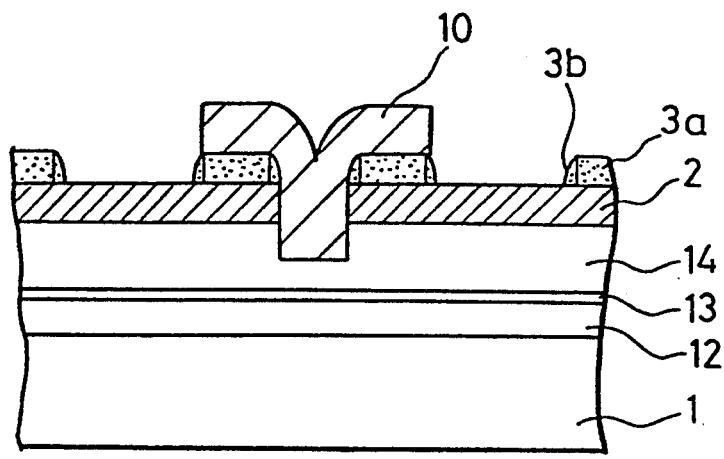
Figure 6G:
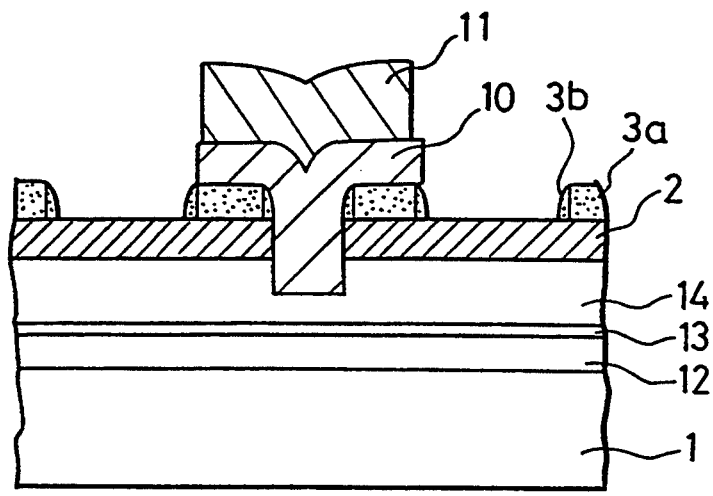

Next, the refractory metal 10 is deposited by sputtering, as shown in FIG. 6(d). The photoresist 16 is patterned and the refractory metal 10 is etched by RIE, as shown in FIG. 6(e). The thermohardening resin 3 on the source and drain is removed with hydrofluoric acid, as shown in FIG. 6(f). Annealing removes the damage caused by sputtering of the refractory metal 10. Next, as shown in FIG. 6(g), low resistance metal 11 is deposited by sputtering or is vapor deposited on the refractory metal gate and is again patterned.

Figure 6H:
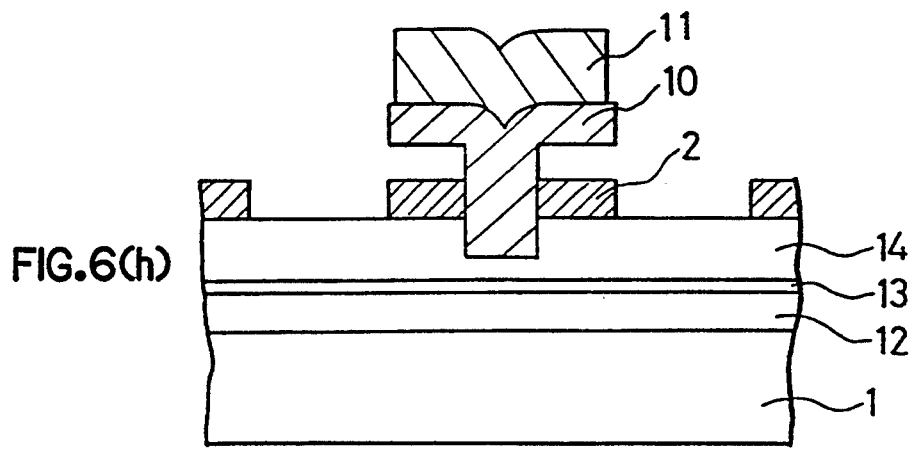

The SiN film 2 is etched using the thermohardening resin 3a and 3b as a mask and the hardened thermohardening resin 3a and 3b is removed with hydrofluoric acid, as shown in FIG. 6(h). The etching rate of the thermohardening resin 3a and 3b is about ten times that of the SiN film 2.

Figure 6I:
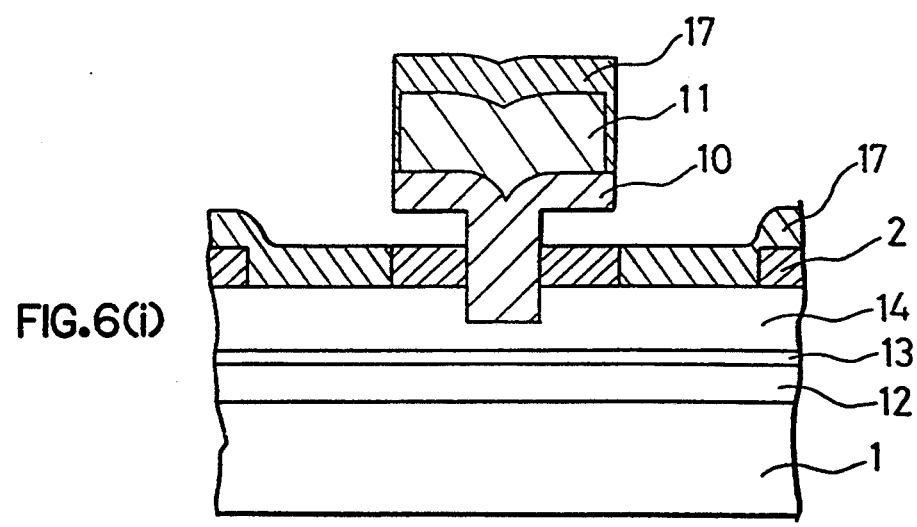
Figure 6J:
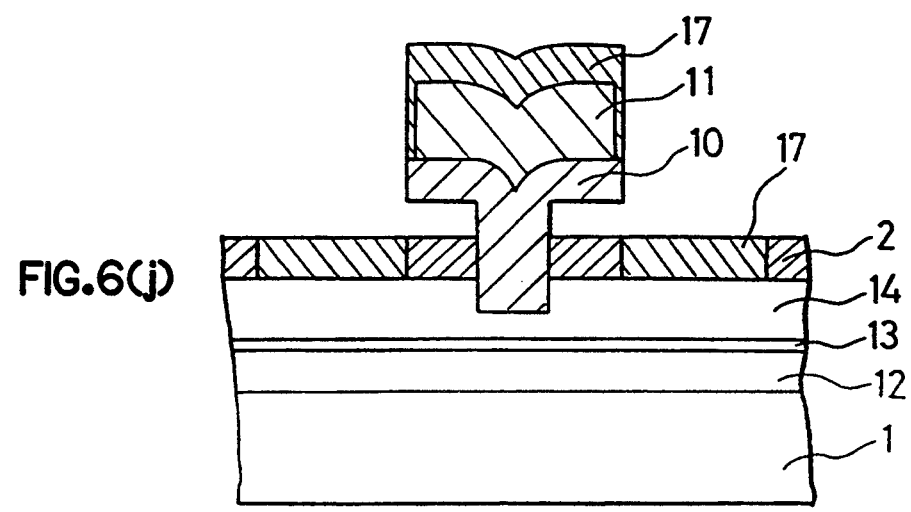
Figure 8A:
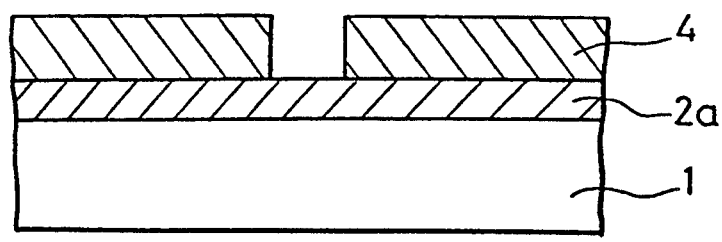
FIGS. 8(a)-8(c) are cross-sectional side views showing a method of producing a semiconductor device according to the prior art.
Figure 8B:
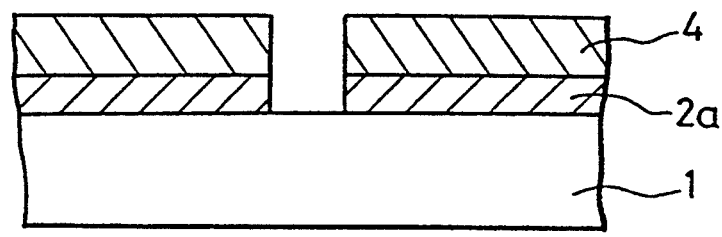
Figure 8C:
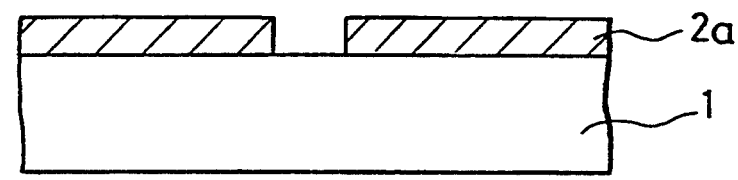
Figure 9A:
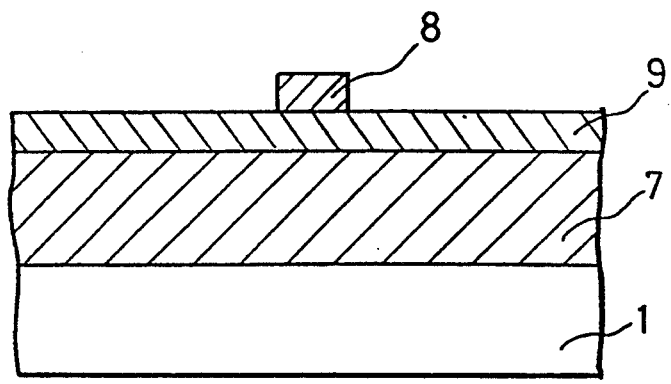
FIGS. 9(a)-9(c) are cross-sectional side views showing a method of producing a semiconductor device according to another prior art production method.
Figure 9B:
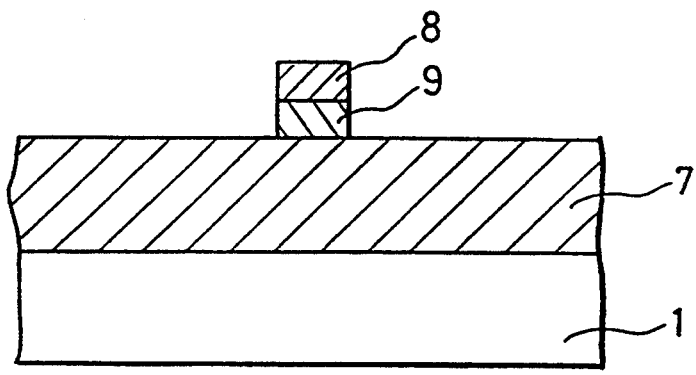
Figure 9C:
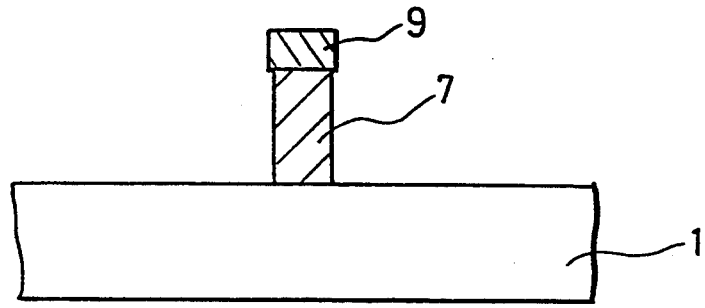

Next, an ohmic contact is evaporated, as shown in FIG. 6(i), and patterned to remove the ohmic contact from other than the gate, source, and drain, as shown in FIG. 6(j). Sintering completes the HEMT.

In the above-illustrated embodiment, the SiN film 2 is not required if the process according to the second embodiment is employed in the ion implantation process.

When refractory metal 10 is not sputtered but is evaporated, if a low resistance metal 11 is deposited, as shown in FIG. 6(d), and the process of FIG. 6(e) is carried out to produce the structure of FIG. 6(g), one patterning process can be omitted.

In the HEMT device of the present invention, the distance between the gate and the source and the distance between the gate and the drain can be determined by the first patterning shown in FIG. 6(a) and a narrow pattern gate can be produced.

As is evident from the foregoing description, according to the present invention, photoresist is on a thermohardening resin is formed into a pattern and a particle beam irradiates the resin using the photoresist as a mask to harden the thermohardening resin. After the photoresist is removed, an inverted pattern is produced by selectively removing the non-hardened resin, and the inverted pattern is transferred to the underlying metal, insulating film, or photoresist. Therefore, the broadening of the pattern during production of an aperture and shrinkage of a pattern during the production of a triple-layer photoresist are prevented.

Since ions of the kind which are to be donors, acceptors, or deep levels in the semiconductor are implanted at an implantation energy at which the ions reach the semiconductor substrate, an ion implantation region can be produced in the substrate simultaneously with the inverted pattern, that is, the production process is simplified, and the active region or insulating region can be produced self-aligned with the inverted pattern by subsequent annealing.

In a production method in which ions are implanted at an energy at which the ions cannot reach the substrate and thereafter ions which are to be the donors, acceptors, or deep levels in the semiconductor are implanted at an implantation energy at which the ions can reach the semiconductor substrate and the aperture pattern is produced self-aligned with the implantation region by transferring the above-described pattern, the fine pattern gate electrode is self-aligned with the active region and the kind and the amount of the implantation into the active layer can be arbitrarily determined. In addition, in another production method in which an active region and insulating region are produced in the substrate simultaneously with the production of the inverted pattern and the pattern is transferred to produce an aperture pattern, the aperture pattern is produced self-aligned with these regions, and a MESFET of high reliability can be easily produced by depositing a metal in this aperture, forming a Schottky barrier and forming ohmic contacts on the ion implanted region.

Furthermore, when a gate electrode is produced in an aperture pattern produced by transfer of the inverted pattern and source and drain electrodes are provided at the other aperture patterns, an HEMT having a narrow gate self-aligned with the source and drain electrodes is produced and the distance between the gate and source and the distance between the gate and drain are determined by patterning when the inverted pattern is produced by ion implantation.

What is claimed is:

1. A process for producing a semiconductor device comprising:

forming an active region in a semiconductor substrate;

depositing a thermohardening resin on the active region in said semiconductor substrate;

producing a photoresist pattern on said thermohardening resin;

irradiating said thermohardening resin with a particle beam using said photoresist pattern as a mask to harden said thermohardening resin where irradiated;

after irradiating said thermohardening resin, implanting ions producing one of donors, acceptors, and deep levels in said semiconductor substrate using said photoresist pattern as a mask so that the ions penetrate through said hardened thermohardening resin and penetrate into said semiconductor substrate to produce spaced apart ion implanted regions in said semiconductor substrate;

removing said photoresist pattern and the portion of said thermohardening resin not irradiated by the particle beam, leaving an aperture defined by remaining hardened thermohardening resin; and transferring the pattern of said remaining hardened thermohardening resin onto said semiconductor substrate by depositing a metal in the aperture, forming a Schottky barrier with said semiconductor substrate.

2. The process of claim 1 including, after depositing a metal in the aperture to form a Schottky barrier with said semiconductor substrate, removing said hardened thermohardening resin from said portions of said spaced apart ion implanted regions and depositing a metal forming ohmic contacts with said ion implanted regions to form source and drain electrodes, thereby producing a MESFET.

3. The process of claim 1 wherein an electrically insulating film is disposed on said semiconductor substrate between said substrate and said thermohardening resin including transferring the pattern of said remaining hardened thermohardening resin onto said electrically insulating film by extending the aperture to penetrate through said electrically insulating film and reach said semiconductor substrate.

4. A process for producing a semiconductor device comprising:

forming an active region in a semiconductor substrate;

depositing spin-on glass (SOG) on the active region in said semiconductor substrate;

producing a photoresist pattern on said SOG;

irradiating said SOG with a particle beam using said photoresist pattern as a mask to convert said SOG into a glass where irradiated;

after irradiating said SOG, implanting ions producing one of donors, acceptors, and deep levels in said semiconductor substrate using said photoresist pattern as a mask so that the ions penetrate through said glass and penetrate into said semiconductor substrate to produce spaced apart ion implanted regions in said semiconductor substrate;

removing said photoresist pattern and the portion of said SOG not irradiated by the particle beam, leaving an aperture defined by remaining glass; and transferring the pattern of said remaining glass onto said semiconductor substrate by depositing a metal in the aperture, forming a Schottky barrier with said semiconductor substrate.

5. The process of claim 4 including, after depositing a metal in the aperture to form a Schottky barrier with said semiconductor substrate, removing said glass from said portions of said spaced apart ion implanted regions and depositing a metal forming ohmic contacts with said ion implanted regions to form source and drain electrodes, thereby producing a MESFET.

6. The process of claim 4 wherein an electrically insulating film is disposed on said semiconductor substrate between said substrate and said SOG including transferring the pattern of said remaining glass onto said electrically insulating film by extending the aperture to penetrate through said electrically insulating film and reach said semiconductor substrate.

7. The method of claim 4 including, after implanting ions and before removing said remaining glass, annealing said semiconductor substrate.

* * * * *